(12) United States Patent
Zhang et al.

(10) Patent No.: US 10,043,944 B2
(45) Date of Patent: Aug. 7, 2018

(54) LIGHT EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Jie Zhang, Xiamen (CN); Xueliang Zhu, Xiamen (CN); Chengxiao Du, Xiamen (CN); Jianming Liu, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/847,844

(22) Filed: Dec. 19, 2017

(65) Prior Publication Data
US 2018/0122988 A1    May 3, 2018

Related U.S. Application Data

(63) Continuation of application No. PCT/CN2016/097802, filed on Sep. 1, 2016.

(30) Foreign Application Priority Data

Nov. 2, 2015 (CN) .......................... 2015 1 0729267

(51) Int. Cl.
*H01L 33/14* (2010.01)
*H01L 33/32* (2010.01)
(Continued)

(52) U.S. Cl.
CPC ............ *H01L 33/14* (2013.01); *H01L 33/007* (2013.01); *H01L 33/06* (2013.01); *H01L 33/24* (2013.01); *H01L 33/32* (2013.01)

(58) Field of Classification Search
CPC ....... H01L 33/14; H01L 33/24; H01L 33/007; H01L 33/32; H01L 33/06
See application file for complete search history.

(56) References Cited

U.S. PATENT DOCUMENTS 6,984,841 B2 *   1/2006   Tsuda ..................... B82Y 20/00
                                                              257/12
7,193,236 B2 *   3/2007   Lee ......................... H01L 33/04
                                                              257/103
(Continued)

FOREIGN PATENT DOCUMENTS

CN            104393124 A         3/2015

*Primary Examiner* — William Coleman
(74) *Attorney, Agent, or Firm* — Syncoda LLC; Feng Ma; Junjie Feng

(57) ABSTRACT

A light-emitting diode (LED) epitaxial structure includes, from bottom to up, a substrate, a first conductive type semiconductor layer, a super lattice, a multi-quantum well layer with V pits, a hole injection layer and a second conductive type semiconductor layer. The hole injection layer appears in the shape of dual hexagonal pyramid, which fills up the V pits and embeds in the second conductive type semiconductor layer. Various embodiments of the present disclosures can effectively reduce point defect density and dislocation density of semiconductor material and effectively enlarge hole injection area and improves hole injection efficiency.

19 Claims, 11 Drawing Sheets

(51) Int. Cl.
*H01L 33/06* (2010.01)
*H01L 33/00* (2010.01)
*H01L 33/24* (2010.01)

(56) References Cited

U.S. PATENT DOCUMENTS

| | | | | |
|---|---|---|---|---|
| 8,129,711 | B2 * | 3/2012 | Kang | H01L 33/0075 |
| | | | | 257/17 |
| 8,592,800 | B2 * | 11/2013 | Moustakas | H01L 21/02378 |
| | | | | 257/13 |
| 8,761,218 | B2 * | 6/2014 | Lin | B82Y 20/00 |
| | | | | 372/43.01 |
| 8,772,825 | B2 * | 7/2014 | Sheu | H01L 33/04 |
| | | | | 257/103 |
| 9,269,864 | B2 * | 2/2016 | Choi | H01L 33/22 |
| 9,337,391 | B2 * | 5/2016 | Jean | H01L 33/325 |
| 2014/0103359 | A1 * | 4/2014 | Shim | H01L 33/24 |
| | | | | 257/76 |
| 2014/0131743 | A1 | 5/2014 | Jiang et al. | |
| 2016/0380155 | A1 * | 12/2016 | Jeong | H01L 33/22 |
| | | | | 257/101 |
| 2017/0194476 | A1 * | 7/2017 | Brueck | H01L 21/02381 |

* cited by examiner

US 10,043,944 B2

LIGHT EMITTING DIODE AND FABRICATION METHOD THEREOF

CROSS-REFERENCE TO RELATED APPLICATIONS

The present application is a continuation of, and claims priority to, PCT/CN2016/097802 filed on Sep. 1, 2016, which claims priority to Chinese Patent Application No. 201510729267.9 filed on Nov. 2, 2015. The disclosures of these applications are hereby incorporated by reference in their entirety.

BACKGROUND

Light Emitting Diode (LED) is a semiconductor solid light-emitting device, using semiconductor PN junction as the light-emitting material for direct photovoltaic conversion. At present, the InGaN/GaN light-emitting diode is regarded as the most potential light-emitting source. However, due to low hole concentration and hole mobility of the P—GaN material, the injection depth in the multi-quantum well (MQW) is limited, which greatly restricts further improvement of GaN-based LED light-emitting efficiency.

SUMMARY

The inventors of the present application have recognized that, as verified by more theoretical research and test results, V defects are very important hole injection channels in the GaN-based LED, which greatly improves hole injection efficiency. However, the quantum well (QB) grown on the side wall of the V pits still forms barrier which influences injection efficiency of the hole to the quantum well, thus reducing light-emitting efficiency; in addition, low hole concentration of the P—GaN layer material remains a problem to be solved.

The present disclosure relates to the semiconductor optoelectronic device field, and more particularly, to a LED epitaxial structure and fabrication method thereof.

The present disclosure provides a LED epitaxial structure and fabrication method thereof, where a hole injection layer with dual hexagonal pyramid shape is formed in the multi-quantum well layer with V pits, which can effectively reduce point defect density and dislocation density of semiconductor material, providing high density holes, thus improving injection efficiency and LED light-emitting efficiency.

According to one aspect of the present disclosure, a light-emitting diode with high hole injection efficiency is provided, which includes from bottom to up: a first conductive type semiconductor layer, a super lattice, a multi-quantum well layer with V pits, a hole injection layer and a second conductive type semiconductor layer, wherein, the hole injection layer appears in a dual hexagonal pyramid shape, which fills up the V pits and embeds in the second conductive type semiconductor layer.

In some embodiments, form a buffer layer over the substrate, which prefers to be InAlGaN.

In some embodiments, the first conductive type semiconductor layer includes an N—GaN layer, or a U—GaN layer and an N—GaN layer.

In some embodiments, the second conductive type semiconductor layer includes a P—GaN layer, or an electronic blocking layer and a P—GaN layer, or an electronic blocking layer, a P—GaN layer and a contact layer.

In some embodiments, the hole injection layer material is $In_xGa_{1-x}N$ ($0<x\leq1$); the material of the multi-quantum well layer is $In_yAl_zGa_{1-y-z}N$ ($0<y\leq1$, $0\leq z\leq1$, $0<y+z\leq1$), where, x and y satisfy the relational expression $0<x<y\leq1$.

In some embodiments, the absorption wavelength of the hole injection layer is shorter than the light-emitting wavelength of the multi-quantum well layer.

According to a second aspect of the present disclosure, a fabrication method of a LED epitaxial structure is provided, which includes:

(1) providing a substrate;
(2) growing a first conductive type semiconductor layer over the substrate;
(3) growing a super lattice over the first conductive type semiconductor layer;
(4) growing a multi-quantum well layer with V pits over the super lattice;
(5) growing a hole injection layer in the V pits, which fills up and is higher than the V pits, until a hole injection layer of dual hexagonal pyramid shape is formed;
(6) growing a second conductive type semiconductor layer over the top surface of the multi-quantum well layer and the hole injection layer.

In some embodiments, grow a buffer layer over the substrate, and the material prefers to be InAlGaN.

In some embodiments, the first conductive type semiconductor layer includes an N—GaN layer, or includes a U—GaN layer and an N—GaN layer.

In some embodiments, the second conductive type semiconductor layer includes a P—GaN layer, or includes an electronic blocking layer and a P—GaN layer, or includes an electronic blocking layer, a P—GaN layer and a contact layer.

In some embodiments, the hole injection layer material is $In_xGa_{1-x}N$ ($0<x\leq1$); the material of the multi-quantum well layer is $In_yAl_zGa_{1-y-x}N$ ($0<y\leq1$, $0\leq z\leq1$, $0<y+z\leq1$), where, x and y satisfy the relational expression $0<x<y\leq1$.

In some embodiments, the absorption wavelength of the hole injection layer is shorter than the light-emitting wavelength of the multi-quantum well layer.

In some embodiments, grow an electronic blocking layer over the top surface of the multi-quantum well layer.

In some embodiments, the hole injection layer of dual hexagonal pyramid shape in step (5) is formed via 3D epitaxial growth in a $H_2$-free environment with reaction pressure >400 tor, growth temperature of 750-850° C. and growth rate of 0.1-0.5 µm/h.

In some embodiments, before step (6), the fabrication method also includes forming a mask material layer on the top surface of the multi-quantum well layer or the top surface of the electronic blocking layer, growing a hole injection layer of dual hexagonal pyramid shape in the V pits, and removing the mask material layer.

In some embodiments, the mask material layer is formed via coating deposition in small angle ($\leq15°$) to avoid formation in the V pits.

In some embodiments, the mask material layer is made of $Mg_xN_y$, $Si_xN_y$, $Si_xO_y$, $Ti_xO_y$, $Zr_xO_y$, $Hf_xO_y$, $Ta_xO_y$, or any of their combinations.

According to a third aspect of the present disclosure, a light-emitting system comprising a plurality of light-emitting diodes is provided. Each light-emitting diode further comprises from bottom to up: a first conductive type semiconductor layer, a super lattice, a multi-quantum well layer with V pits, a hole injection layer and a second conductive type semiconductor layer, wherein, the hole injection layer appears in a dual hexagonal pyramid shape, which fills up the V pits and embeds in the second conductive type semiconductor layer. The system can be used in, for example, lighting, signage, display, etc.

Compared with existing technologies, various embodiments of the present disclosure may have one or more of the following technical effects:

(1) forming a hole injection layer over the multi-quantum well layer with V pits via high-pressure 3D epitaxial growth, which effectively reduces point defect density and dislocation density of semiconductor material.

(2) embedding the V pits and the second-conductive type semiconductor layer in the hole injection layer of dual hexagonal pyramid shape, which effectively enlarges hole injection area and improves hole injection efficiency.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

In the drawings: 1: substrate; 2: buffer layer; 3: U—GaN layer (non-doped or unintentionally-doped GaN layer); 4: N—GaN layer; 5: super lattice; 6: multi-quantum well layer; 7: electronic blocking layer; 8: hole injection layer; 9: P—GaN layer; 10: contact layer; 11: mask material layer.

DETAILED DESCRIPTION

The present disclosure will be explained in details with reference to the accompanying drawings. Before further description, it should be understood, however, that various modifications and changes may be made to these embodiments. Therefore, the present disclosure is not limited to the embodiments below. It should also be noted that the scope of the present disclosure should still be subjected to the scope defined in the claims and the embodiments are merely for purposes of illustration, rather than restricting. Unless otherwise specified, all technical and scientific words shall have the same meanings as understood by persons skilled in the art.

Embodiment 1

Figure 1:
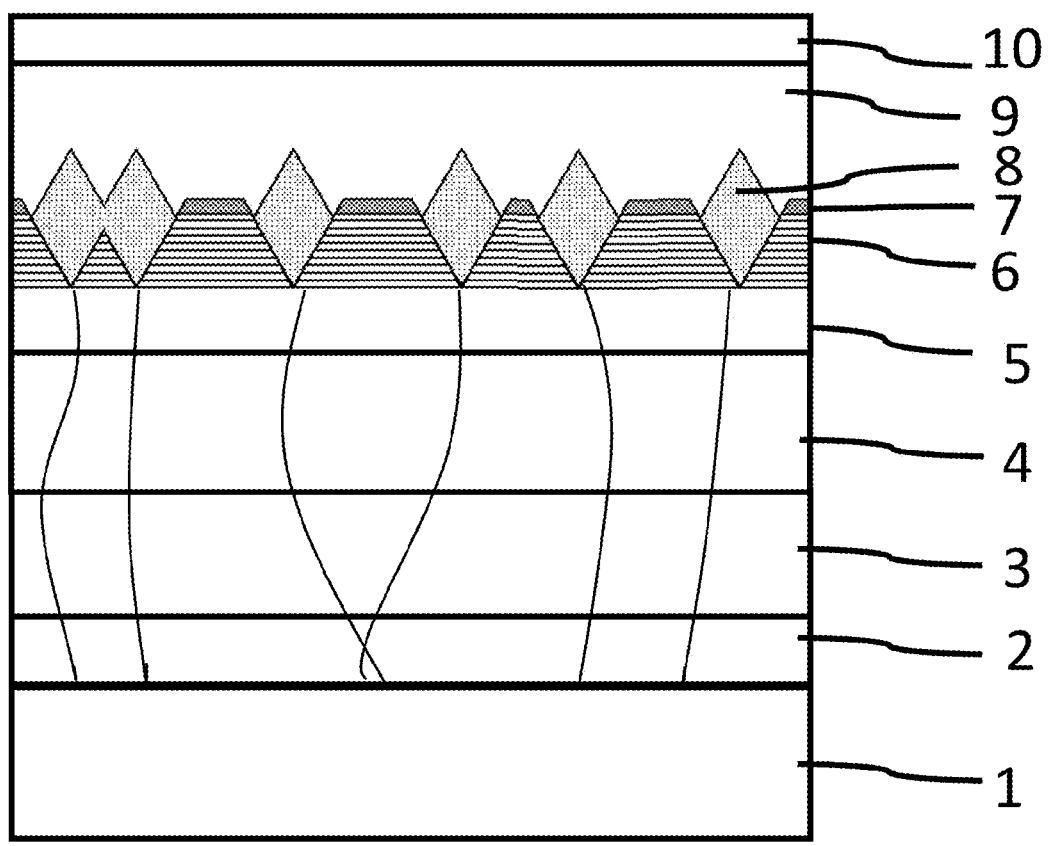
FIG. 1 illustrates a sectional view of the LED epitaxial structure according to Embodiment 1 of the present disclosure.
Figure 2:
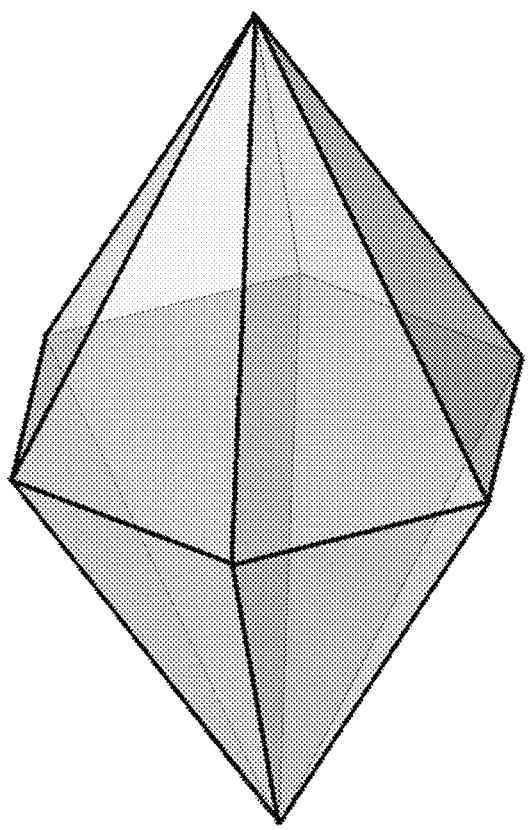
FIG. 2 illustrates a 3D schematic diagram of the hole injection layer of dual hexagonal pyramid shape in FIG. 1.

With reference to FIGS. 1-2, an LED epitaxial structure is provided, which includes from bottom to up: a substrate 1, a buffer layer 2, a first conductive type semiconductor layer including a U—GaN layer 3 and an N—GaN layer 4, a super lattice 5, a multi-quantum well layer 6 with V pits, an electronic blocking layer 7, a hole injection layer of dual hexagonal pyramid shape 8, and a second conductive type semiconductor layer including a P—GaN layer 9 and a contact layer 10, wherein the hole injection layer of dual hexagonal pyramid shape 8 fills up the V pits and embeds in the second conductive type semiconductor layer.

Specifically, the substrate 1 in this embodiment is selected from at least one of sapphire ($Al_2O_3$), SiC, GaAs, GaN, ZnO, Si, GaP, InP and Ge. Preferably, a plain sapphire substrate is preferred, which is not illustrated. The sapphire substrate can also be a patterned sapphire substrate (PSS), but the embodiments are not limited thereto.

The buffer layer 2 made of InAlGaN semiconductor material is formed over the substrate 1, which eliminates the lattice mismatch caused by lattice constant difference between the substrate 1 and the first-conductive type semiconductor layer, thus improving epitaxial growth quality.

The U—GaN layer 3 and the N—GaN layer 4 form the first conductive type semiconductor layer, which are successively grown over the buffer layer 2. The U—GaN layer 3 can eliminate the lattice mismatch caused by lattice constant difference between the substrate 1 and the N—GaN layer 4. In addition, the U—GaN layer 3 can improve the crystallization property of the semiconductor layer formed over this layer.

The super lattice 5, formed over the first conductive type semiconductor layer, is repeatedly and alternatively stacked by InGaN layers and GaN layers for about 15-25 times.

The multi-quantum well layer 6 with V pits and the electronic blocking layer 7 are successively formed over the super lattice 5. The multi-quantum well layer can be $In_yAl_zGa_{1-y-z}N$ ($0<y\leq1$, $0\leq z\leq1$, $0<y+z\leq1$) semiconductor material, which is formed alternatively by a plurality of well layers and barrier layers. The electronic blocking layer is P-type AlGaN semiconductor material.

The hole injection layer of dual hexagonal pyramid shape 8 fills up and is higher than the V pits. The hole injection layer material is $In_xGa_{1-x}N$ ($0<x\leq1$). In some embodiments, the In component in the hole injection layer is smaller than the In component in the $In_yAl_zGa_{1-y-z}N$ quantum well, i.e., $0<x<y\leq1$; the absorption wavelength of the hole injection layer is shorter than the light-emitting wavelength of the multi-quantum well layer. This prevents the P-type InGaN material with large forbidden bandwidth from absorbing light emitted from the multi-quantum well (MQW) layer, which lowers light-emitting efficiency.

The P—GaN layer 9 and the contact layer 10 form the second conductive type semiconductor layer, which are grown over the top surface of the electronic blocking layer 7 and the hole injection layer of dual hexagonal pyramid shape 8, so that the hole injection layer of dual hexagonal pyramid shape embeds to the second conductive type semiconductor layer, to enlarge hole injection area and improve hole injection efficiency.

Embodiment 2

Figure 3:
FIG. 3 shows a diagram of step 1 in the fabrication process of the LED epitaxial structure according to Embodiment 2 of the present disclosure.

Referring to FIGS. 3-12, this embodiment provides a fabrication method of a LED epitaxial structure, which includes:

(1) Referring to FIG. 3, provide a substrate 1, which can be selected from at least one of sapphire ($Al_2O_3$), SiC, GaAs, GaN, ZnO, Si, GaP, InP and Ge. In some embodiments, a patterned sapphire substrate (PSS) is preferred.

Figure 4:
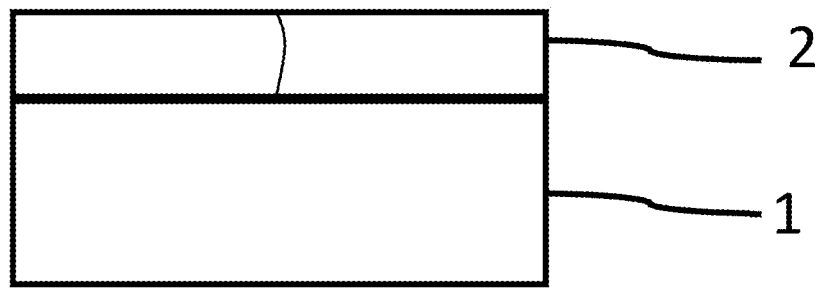
FIG. 4 shows a diagram of step 2 in the fabrication process of the LED epitaxial structure according to Embodiment 2 of the present disclosure.

(2) Referring to FIG. 4, form a buffer layer 2 over the substrate 1, wherein, InAlGaN semiconductor material is preferred. The epitaxial growth method can be MOCVD (metal-organic chemical vapor deposition), CVD (chemical vapor deposition), PECVD (plasma enhanced vapor deposition), MBE (molecular beam epitaxy) and HVPE (hydride vapor phase epitaxy). It is preferred to be MOCVD, but the embodiments are not limited thereto.

Figure 5:
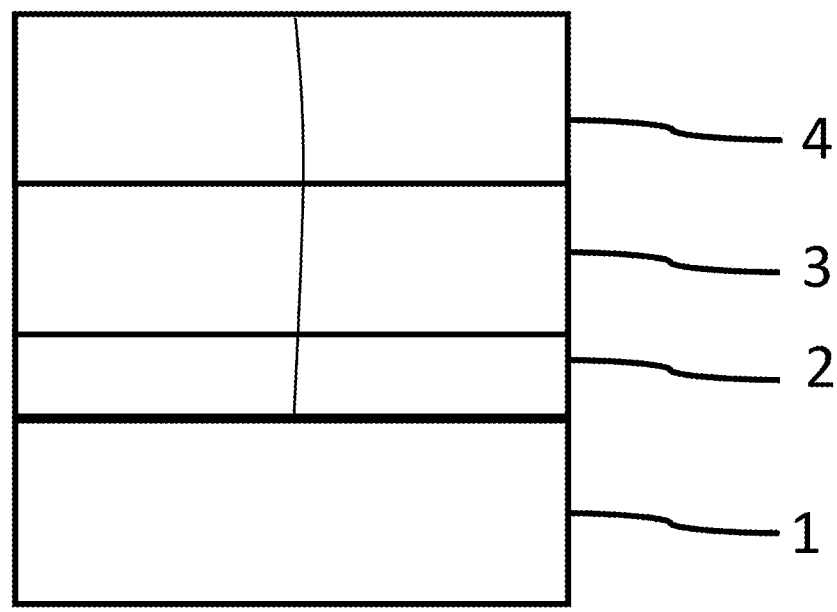
FIG. 5 shows a diagram of step 3 in the fabrication process of the LED epitaxial structure according to Embodiment 2 of the present disclosure.

(3) Referring to FIG. 5, grow a U—GaN layer 3 and an N—GaN layer 4 successively over the buffer layer 2 via epitaxial growth over the buffer layer to form a first conductive type semiconductor layer.

Figure 6:
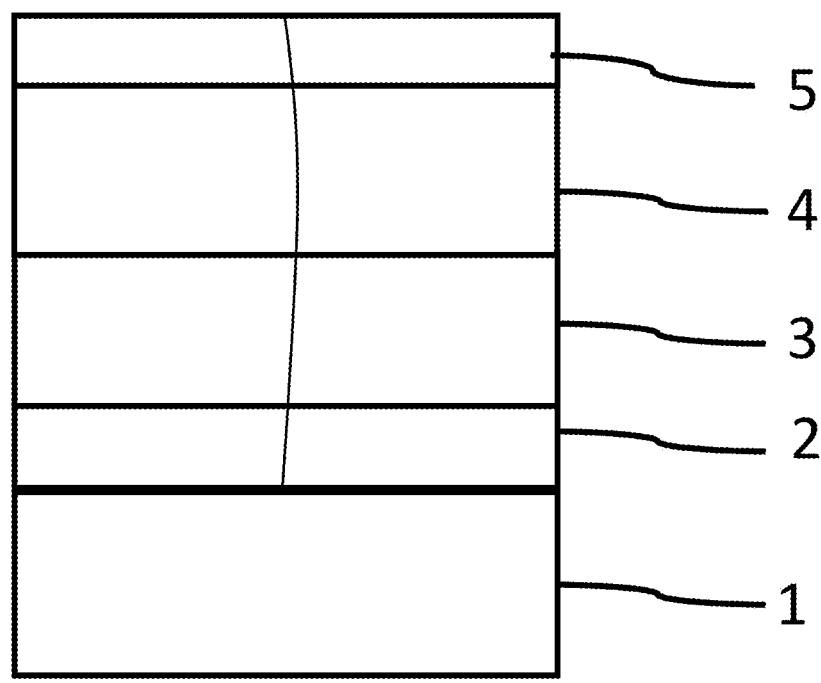
FIG. 6 shows a diagram of step 4 in the fabrication process of the LED epitaxial structure according to Embodiment 2 of the present disclosure.

(4) Referring to FIG. 6, form a super lattice 5 over the first conductive type semiconductor layer via epitaxial growth, which is repeatedly and alternatively stacked by InGaN layers and GaN layers for about 15-25 times.

Figure 7:
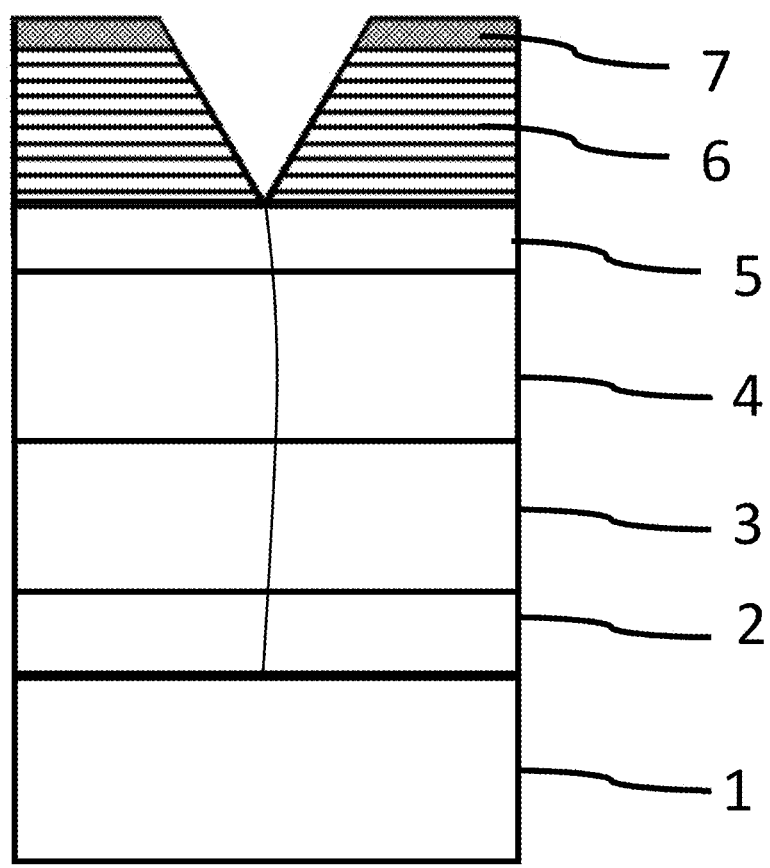
FIG. 7 shows a diagram of step 5 in the fabrication process of the LED epitaxial structure according to Embodiment 2 of the present disclosure.

(5) Referring to FIG. 7, form a multi-quantum well layer 6 with V pits and an electronic blocking layer 7 over the super lattice 5 via epitaxial growth. The multi-quantum well layer can be $In_xAl_yGa_{1-x-y}N$ ($0 \leq x \leq 1$, $0 \leq y \leq 1$, $0 \leq x+y \leq 1$) semiconductor material, which is alternatively stacked by a plurality of well layers and barrier layers The electronic blocking layer is P—AlGaN semiconductor material.

Figure 8:
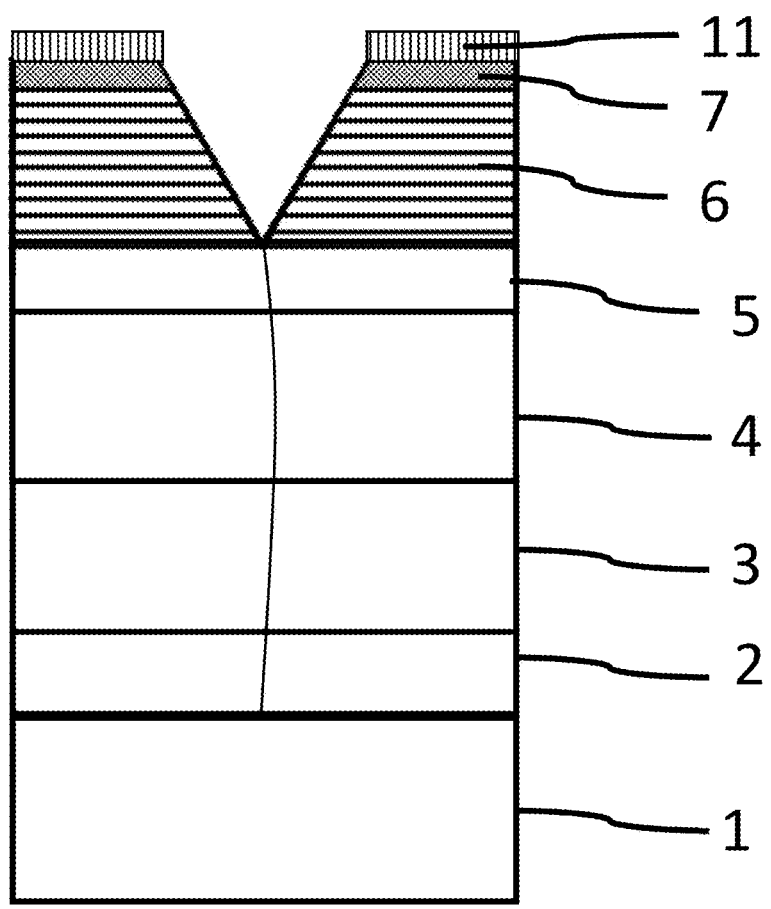
FIG. 8 shows a diagram of step 6 in the fabrication process of the LED epitaxial structure according to Embodiment 2 of the present disclosure.

(6) Referring to FIG. 8, sputter a mask material layer 11 over the top surface of the electronic blocking layer 7 with a small angle ($\leq 15°$) to avoid formation in the V pits. The mask material layer can be $Mg_xN_y$, $Si_xN_y$, $Si_xO_y$, $Ti_xO_y$, $Zr_xO_y$, $Hf_xO_y$, $Ta_xO_y$ or any of their combinations. In this embodiment, the mask material layer prefers to be $SiO_2$.

Figure 9:
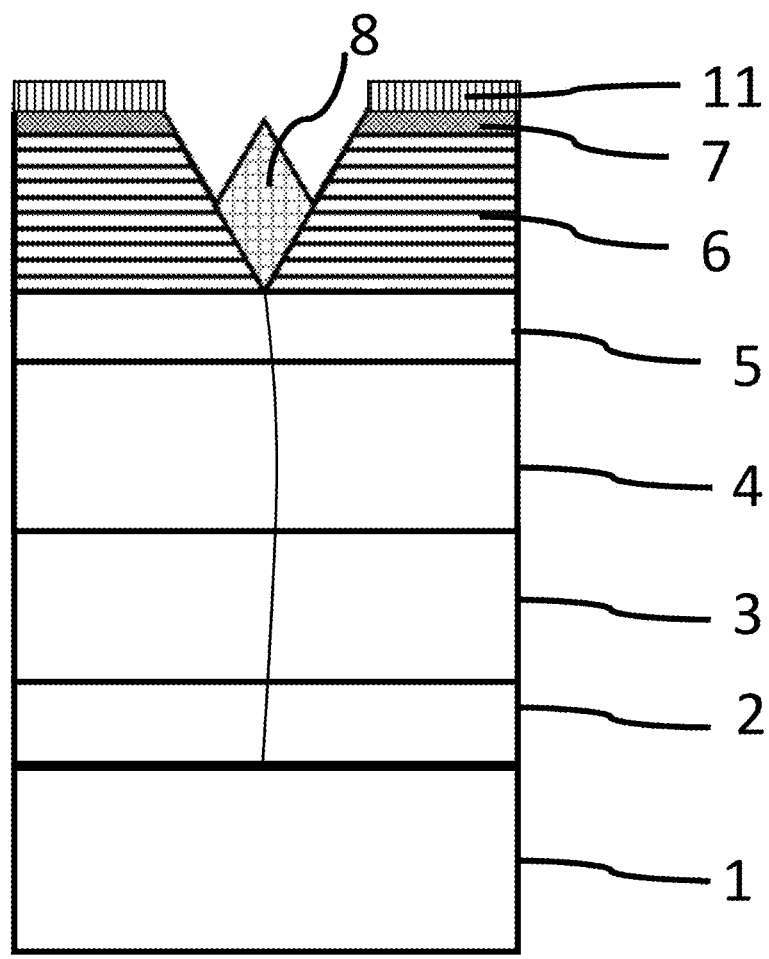
FIG. 9 shows a diagram of step 7 in the fabrication process of the LED epitaxial structure according to Embodiment 2 of the present disclosure.

(7) Referring to FIG. 9, form an InGaN hole injection layer 8 via 3D epitaxial growth method in a $H_2$-free environment with reaction pressure >400 tor, growth temperature of 750-850° C. and growth rate of 0.1-0.5 μm/h. As the hole injection layer cannot be grown over the mask material layer 11, thus restricting the epitaxial growth in the V pits.

Figure 10:
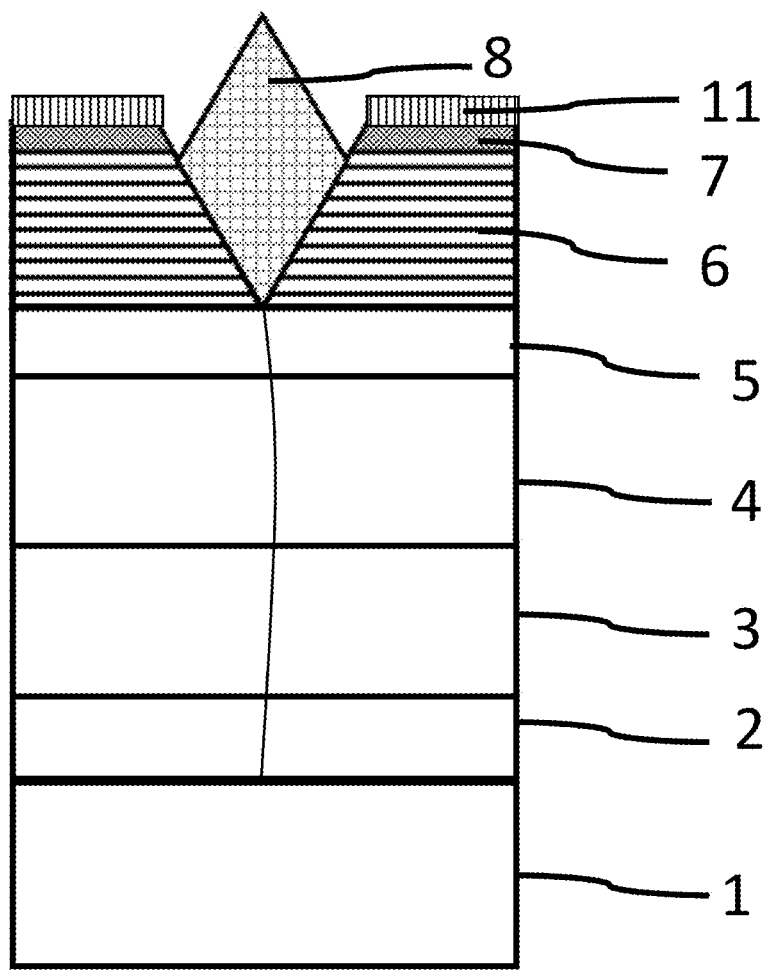
FIG. 10 shows a diagram of step 8 in the fabrication process of the LED epitaxial structure according to Embodiment 2 of the present disclosure.

(8) Referring to FIG. 10, grow an InGaN hole injection layer 8 via second epitaxial growth until it fills up and is higher than the V pits, thus forming a dual hexagonal pyramid pattern with twelve {1-101} surfaces. Form an InGaN hole injection layer via high-pressure 3D growth, which can effectively reduce point defect den-sity and dislocation density of semiconductor material, thus improving lattice quality and hole concentration.

Figure 11:
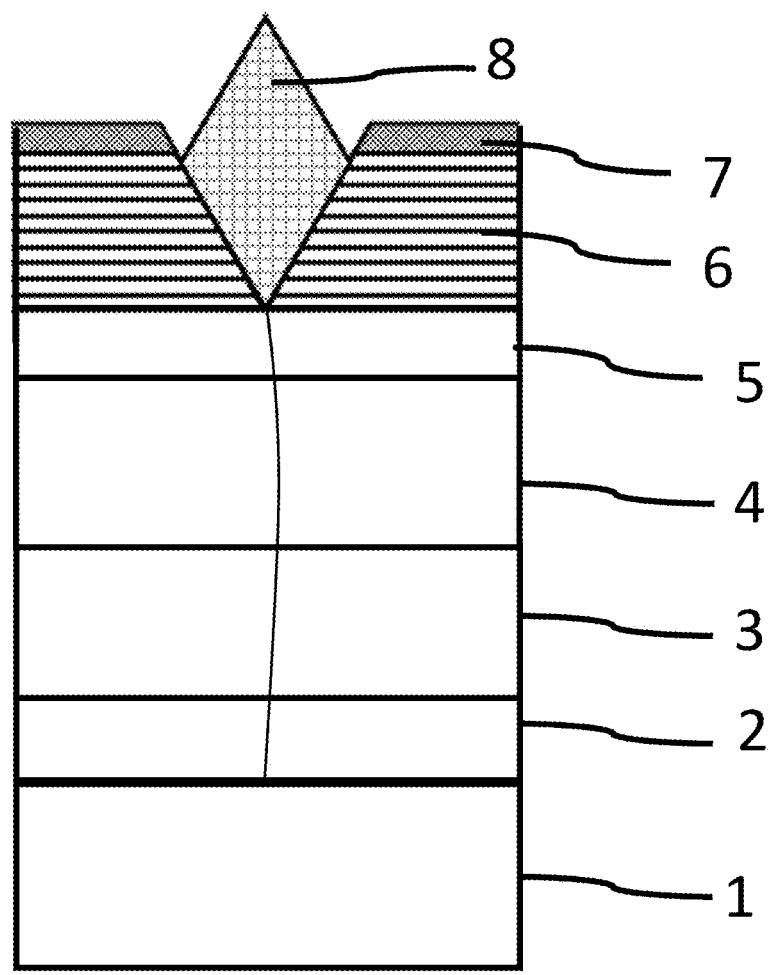
FIG. 11 shows a diagram of step 9 in the fabrication process of the LED epitaxial structure according to Embodiment 2 of the present disclosure.

(9) Referring to FIG. 11, remove the $SiO_2$ mask material layer 11 with BOE solution.

Figure 12:
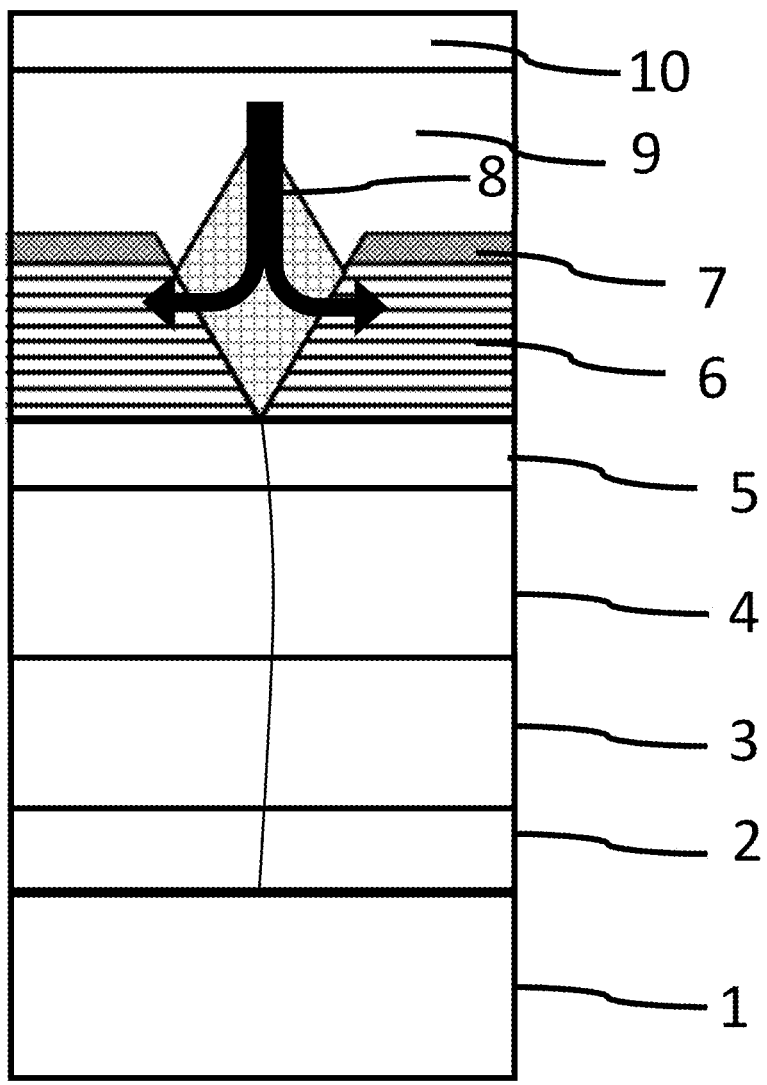
FIG. 12 shows a diagram of step 10 in the fabrication process of the LED epitaxial structure according to Embodiment 2 of the present disclosure.

(10) Referring to FIG. 12, continue to form a P—GaN layer 9 and a contact layer 10 over the top surface of the electronic blocking layer 7 and the hole injection layer of dual hexagonal pyramid shape 8 to form a second conductive type semiconductor layer so that the hole injection layer of dual hexagonal pyramid shape embeds to the second conductive type semiconductor layer, thus enlarging hole injection area and improving hole injection efficiency.

Embodiment 3

Figure 13:
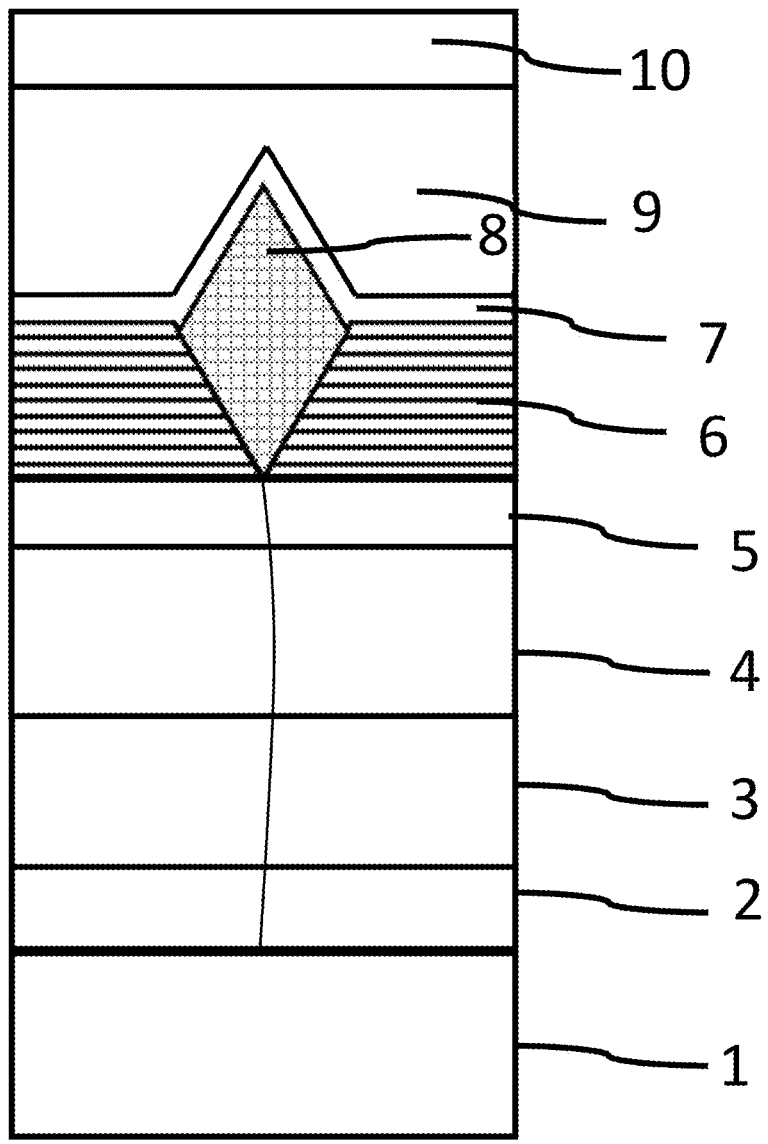
FIG. 13 illustrates a sectional view of the LED epitaxial structure according to Embodiment 3 of the present disclosure.

Referring to FIG. 13, the difference between this embodiment and Embodiment 2 is that: in Embodiment 2, an electronic blocking layer 7 is formed over the top surface of the multi-quantum well layer 6 with V pits before the hole injection layer 8 is formed; however, in this embodiment, the second conductive type semiconductor layer is formed over the top surface of the multi-quantum well layer 6 with V pits and the hole injection layer 8 after the hole injection layer 8 is formed.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode, comprising:
a first conductive type semiconductor layer;
a super lattice;
a multi-quantum well layer with V pits;
a hole injection layer; and
a second-conductive type semiconductor layer;
wherein the hole injection layer appears in a dual hexagonal pyramid shape, which fills up the V pits and embeds in the second conductive type semiconductor layer.

2. The light-emitting diode of claim 1, wherein, the hole injection layer material is $In_xGa_{1-x}N$ ($0<x\leq1$), wherein, x and y satisfy the relational expression $0<x<y\leq1$.

3. The light-emitting diode of claim 1, wherein, the material of the multi-quantum well layer is $In_yAl_zGa_{1-y-z}N$ ($0<y\leq1$, $0\leq z\leq1$, $0<y+z\leq1$), wherein, x and y satisfy the relational expression $0<x<y\leq1$.

4. The light-emitting diode of claim 1, wherein, the absorption wavelength of the hole injection layer is shorter than the light-emitting wavelength of the multi-quantum well layer.

5. The light-emitting diode of claim 1, wherein, the first conductive type semiconductor layer comprises an N—GaN layer, or comprises a U—GaN layer and an N—GaN layer.

6. The light-emitting diode of claim 1, wherein, the second conductive type semiconductor layer comprises a P—GaN layer, or comprises an electronic blocking layer and a P—GaN layer, or comprises an electronic blocking layer, a P—GaN layer and a contact layer.

7. A fabrication method of a light-emitting diode, comprising:
(1) growing a first conductive type semiconductor layer;
(2) growing a super lattice over the first conductive type semiconductor layer;
(3) growing a multi-quantum well layer with V pits over the super lattice;
(4) growing a hole injection layer in the V pits, which fills up and is higher than the V pits, until a hole injection layer of dual hexagonal pyramid shape is formed;
(5) growing a second conductive type semiconductor layer over the top surface of the multi-quantum well layer and the hole injection layer.

8. The fabrication method of claim 7, wherein, also comprises growing an electronic blocking layer over the top surface of the multi-quantum well layer.

9. The fabrication method of claim 8, wherein, also comprises, before step (5), forming a mask material layer on the top surface of the electronic blocking layer; growing a hole injection layer of dual hexagonal pyramid shape in the V pits; and removing the mask material layer.

10. The fabrication method of claim 7, wherein, the absorption wavelength of the hole injection layer is shorter than the light-emitting wavelength of the multi-quantum well layer.

11. The fabrication method of claim 7, wherein, the hole injection layer of dual hexagonal pyramid shape in step (4) is formed via 3D epitaxial growth in a $H_2$-free environment with reaction pressure >400 tor, growth temperature of 750-850° C. and growth rate of 0.1-0.5 μm/h.

12. The fabrication method of claim 7, further comprises, before step (5), forming a mask material layer on the top surface of the multi-quantum well layer; growing a hole injection layer of dual hexagonal pyramid shape in the V pits; and removing the mask material layer.

13. The fabrication method of claim 7, wherein, the mask material layer is formed via coating deposition in small angle (≤15°) to avoid formation in the V pits.

14. A light-emitting system comprising a plurality of light-emitting diodes, wherein each light-emitting diode comprises, from bottom to up:
a first conductive type semiconductor layer;
a super lattice;
a multi-quantum well layer with V pits;
a hole injection layer; and
a second-conductive type semiconductor layer;
wherein the hole injection layer appears in a dual hexagonal pyramid shape, which fills up the V pits and embeds in the second conductive type semiconductor layer.

15. The light-emitting system of claim 14, wherein, the hole injection layer material is $In_xGa_{1-x}N$ (0<x≤1), wherein, x and y satisfy the relational expression 0<x<y≤1.

16. The light-emitting system of claim 14, wherein, the material of the multi-quantum well layer is $In_yAl_zGa_{1-y-z}N$ (0<y≤1, 0≤z≤1, 0<y+z≤1), wherein, x and y satisfy the relational expression 0<x<y≤1.

17. The light-emitting system of claim 14, wherein, the absorption wavelength of the hole injection layer is shorter than the light-emitting wavelength of the multi-quantum well layer.

18. The light-emitting system of claim 14, wherein, the first conductive type semiconductor layer comprises an N—GaN layer, or comprises a U—GaN layer and an N—GaN layer.

19. The light-emitting system of claim 14, wherein, the second conductive type semiconductor layer comprises a P—GaN layer, or comprises an electronic blocking layer and a P—GaN layer, or comprises an electronic blocking layer, a P—GaN layer and a contact layer.

* * * * *